United States Patent
Latremouille et al.

(10) Patent No.: US 11,539,605 B2
(45) Date of Patent: Dec. 27, 2022

(54) CHANNEL QUALITY DETERMINATION

(71) Applicant: SEMTECH CORPORATION, Camarillo, CA (US)

(72) Inventors: Damien Latremouille, Ottawa (CA); Chad Erven, Ottawa (CA)

(73) Assignee: SEMTECH CORPORATION, Camarillo, CA (US)

( * ) Notice: Subject to any disclaimer, the term of this patent is extended or adjusted under 35 U.S.C. 154(b) by 132 days.

(21) Appl. No.: 17/247,073

(22) Filed: Nov. 27, 2020

(65) Prior Publication Data
US 2022/0173993 A1    Jun. 2, 2022

(51) Int. Cl.
| | | |
|---|---|---|
| H04L 43/0823 | (2022.01) | |
| H04L 27/26 | (2006.01) | |
| H04L 1/20 | (2006.01) | |
| H04L 1/24 | (2006.01) | |
| H03M 13/37 | (2006.01) | |
| H03M 13/00 | (2006.01) | |

(52) U.S. Cl.
CPC .... *H04L 43/0823* (2013.01); *H03M 13/3707* (2013.01); *H03M 13/61* (2013.01); *H04L 1/206* (2013.01); *H04L 1/242* (2013.01); *H04L 27/2649* (2013.01)

(58) Field of Classification Search
CPC ..... H04L 43/0823; H04L 1/206; H04L 1/242; H04L 1/241; H03M 13/3707; H03M 13/61
USPC ......................................................... 375/224
See application file for complete search history.

(56) References Cited

U.S. PATENT DOCUMENTS

| | | | | |
|---|---|---|---|---|
| 2013/0083872 | A1* | 4/2013 | Varikat | .............. H04L 27/0008 375/344 |
| 2014/0072020 | A1* | 3/2014 | Murphy | .............. H04L 27/0014 375/224 |

\* cited by examiner

*Primary Examiner* — Leila Malek
(74) *Attorney, Agent, or Firm* — Alston & Bird LLP

(57) ABSTRACT

This application relates to determining transmission quality of a communication channel, in particular for determining a measure of errors in data transmitted as multi-bit symbols. Described is an error checker with an input for receiving an input signal comprising a series of modulated symbols, wherein each symbol encodes multiple bits of a pseudo-random bit sequence. A demodulator is configured to receive the input signal and only partially demodulate at least some of the symbols to generate a partially demodulated bit sequence. A PRBS module is configured to receive the partially demodulated bit sequence and determine the pseudo-random bit sequence and a comparator compares the output of the demodulator to an expected output based on the pseudo-random bit sequence determined by the PRBS module.

20 Claims, 1 Drawing Sheet

CHANNEL QUALITY DETERMINATION

TECHNICAL FIELD

The present disclosure is related to apparatus and methods for determining transmission quality of a communication channel, in particular for determining a measure of errors in data received via a communication channel in which the data is transmitted as multi-bit symbols.

BACKGROUND

Digital communication is widely used in a range of applications and, in at least some digital communication systems, a transmitter may be arranged to transmit data over a communication channel to a receiver. The communication channel may comprise some physical medium such as a suitable waveguide, e.g. a transmission line for electrical data transmission or an optical fibre for optical data transmission, or the communication channel may be a free space channel for radio frequency transmission or the like. The transmitter may include a modulator for generating a modulated signal based on the data, where the modulated signal comprises a stream of symbols representing the data according to a desired transmission format, and the receiver may receive and demodulate the modulated signal.

In some instances, each symbol may represent a single bit, e.g. the modulator may modulate some physical property to take one of two different states to represent the value of a single bit of data. For example, within each symbol period the signal level of the modulated signal may be modulated to one or two defined levels to represent the relevant value of one bit of data. In at least some applications, however, especially where relatively high rates of data transmission are preferred, the modulated signal may be generated so that each symbol represents multiple bits, for example two bits could be encoded by modulating the signal level to adopt an appropriate one of four different states.

In such digital communication systems, it may be desirable to measure the quality of the transmission via the communication channel. One measure of quality involves determining the extent of any errors in the data received and demodulated. For instance, an error ratio, such as a bit error ratio (BER), may be determined as the ratio of the number of errors to error-free data.

To determine the number of errors, a known sequence of data may be transmitted over the communication channel and the data received and demodulated compared to the known sequence.

Often, a pseudo-random bit sequence (PRBS) may be used for the known data to be transmitted. PRBSs may advantageously be used for the known data as the PRBS can be deterministically generated as required, avoiding the need for the transmitter and receiver to store large strings of test data, and can provide a balanced number of 0s and 1s. A PRBS can also exhibit the statistical behaviour of a truly random sequence, which is useful for testing the channel quality.

In some communication systems, therefore, it may be advantageous for a receiver to include an error checker for receiving data transmitted over the communication channel, which corresponds to a known PRBS, and comparing the data received and decoded with the known PRBS to identify the number of errors.

However, including an error checker as part of a receiver may can add to the size, cost, complexity and power consumption of the receiver.

SUMMARY

Embodiments of the present disclosure relate to methods and apparatus for determining quality of a communication channel, and in particular to error checkers, that at least mitigate some of these issues.

According to some embodiments there is provided an error checker comprising:
  an input for receiving an input signal comprising a series of modulated symbols, wherein each symbol encodes multiple bits of a pseudo-random bit sequence;
  a demodulator configured to receive the input signal and only partially demodulate at least some of the symbols to generate a partially demodulated bit sequence;
  a PRBS module configured to receive the partially demodulated bit sequence and determine the pseudo-random bit sequence; and
  a comparator to compare the output of the demodulator to an expected output based on the pseudo-random bit sequence determined by the PRBS module.

In some embodiments, the demodulator may comprise a detector for generating an output based on a physical property of the input signal which is modulated to encode the multiple bits. The detector may be reconfigurable to vary a demodulation provided by the demodulator.

In some examples, a controller may be configured to control the error checker in a synchronisation phase in which the detector has a first configuration such that the output of the demodulator corresponds to one of the bits encoded by a relevant symbol. In the synchronisation phase the PRBS module may be configured to receive the partially demodulated bit sequence and determine the pseudo-random bit sequence during the synchronisation phase. The controller may be configured to control the error checker, subsequent to synchronisation phase, in a checking phase in which the comparator is controlled to compare the output of the demodulator to an expected output based on the pseudo-random bit sequence determined by the PRBS module. In some embodiments, the controller may be configured to, during at least part of the checking phase, reconfigure the detector to a second configuration so as to provide a different partial demodulation of a symbol.

In some embodiments, the physical property may be a signal level of the input signal. The detector may be a threshold detector for detecting whether or not the signal level is above a defined threshold. In some implementations, a controller may be operable to selectively vary the defined threshold. The PRBS module may be configured to determine the expected output of the demodulator based on the determined pseudo-random bit sequence and the defined threshold. The controller may be operable to selectively vary the defined threshold over a predefined set of thresholds. In some implementations, each symbol of the input signal may be modulated to one of four different modulation signal levels and the predefined set of thresholds comprises a set of three thresholds, each threshold being set between different pairs of adjacent modulation signal levels.

In some implementations, the physical property may be a phase of the input signal and the detector is a detector for detecting a phase modulation of the input signal. The detector may, for instance, be reconfigurable to provide an in-phase or a quadrature demodulation.

In some implementations a controller may be configured to control the demodulator so as to demodulate only some of the symbols of the input signal.

In some examples the error checker may be operable at a sample rate which is lower than a symbol rate of the input signal.

Aspects also relate to receiver for data communication system comprising the error checker of any of the embodiments described herein. The receiver may, in some examples, be configured to receive in the input signal as optical data transmitted over an optical waveguide.

In another aspects, there is provided a method of checking for data errors in a communication channel comprising:
  receiving an input signal comprising a series of modulated symbols, wherein each symbol encodes multiple bits of a pseudo-random bit sequence;
  only partially demodulating at least some of the symbols to generate a partially demodulated bit sequence;
  determining the pseudo-random bit sequence from the partially demodulated bit sequence; and
  comparing the output of the demodulator to an expected output based on the pseudo-random bit sequence determined by the PRBS module.

In some examples, the method may comprise: operating in a synchronisation phase in which partially demodulating at least some of the symbols comprises identifying one of the bits encoded by a relevant symbol and the pseudo-random bit sequence is determined during the synchronisation phase and subsequently operating in a checking phase and wherein the partial demodulation is varied for at least part of the checking phase.

In some instances, the symbols may be modulated in signal level and the symbols are partially demodulated by a threshold detector which compares the signal level to a first threshold during the synchronisation phase and which compares the signal level to a different threshold during at least part of the checking phase.

Unless otherwise indicated to the contrary, any of the features of any of the embodiments described herein may, where compatible, be implemented together with any one or more of the other features of the embodiments.

BRIEF DESCRIPTION OF THE DRAWINGS

To better explain various embodiments and examples of the present disclosure and the principles, example implementation and operation thereof, reference will now be made, by way of example, to the following drawings, in which.

DETAILED DESCRIPTION

Embodiments of the present disclosure relate to methods and apparatus for determining quality of a communication channel, and in particular to error checkers for determining an indication of a number of errors in data received via a communication channel, where the data is transmitted as multi-bit symbols.

In at least some communication systems, data may be transmitted over a communication channel as a series of symbols, where each symbol represents two or more bits of data. For example, data may be transmitted by modulating properties of a transmit signal based on groups of bits. As discussed above it may be desirable to determine a measure of quality of a digital communication channel, which may, in particular, comprise, as an indication of a number of errors in received data, e.g. an indication of the number of errors in a given period of time, i.e. an error rate, and/or an indication of the number of errors compared to error-free data, i.e. an error ratio.

Figure 1:
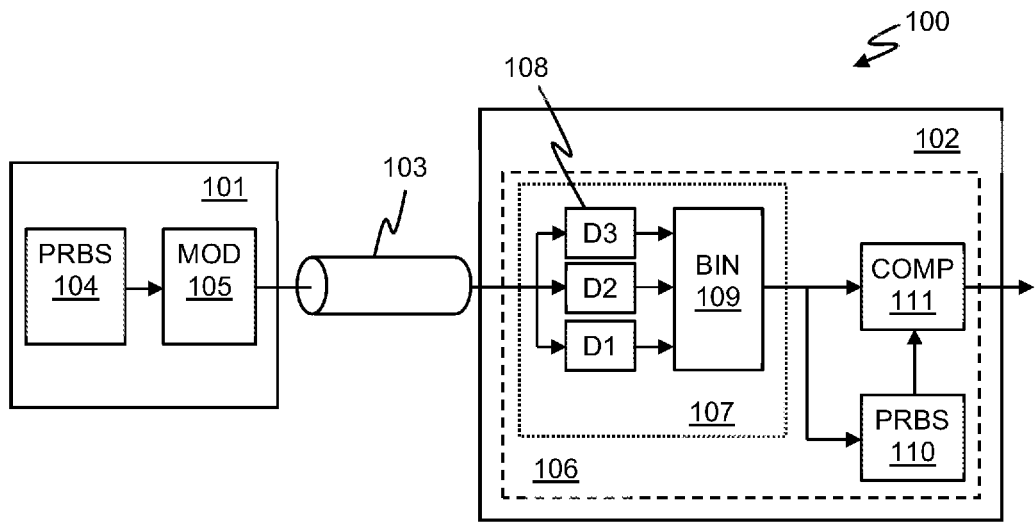
FIG. 1 illustrates a conventional error checker for checking for errors in a multi-bi communication system.

FIG. 1 illustrates one example of how error checking may conventionally be implemented in a communication system 100 that transmits data via multi-bit symbols. FIG. 1 illustrates that the communication system has a transmitter 101 for transmitting data to a receiver 102 over a communication channel 103, which, in this example is illustrated a physical medium such as electrical or optical waveguide, but could, in some implementations, comprise a free space channel. Note that, for clarity, FIG. 1 illustrates just some of the components of the transmitter and receiver that are relevant for error checking and one skilled in the art will understand that there would, in practice, be additional components for transmitting and receiving other data.

For error checking, the transmitter 101 is configured to generate a transmit signal based on some known data, which, in this case, is a pseudo-random bit sequence (PRBS). The transmitter 101 thus includes a PRBS generator 104 that is operable to generate a PRBS of desired length. The PRBS generator 104 may generate the PBRS in a number of different ways, as will be understood by one skilled in the art, and may, for instance, comprise some signal processing module for generating a PRBS according to a defined polynomial, for instance a LFSR (linear feedback shift register) or the like. A modulator 105 receives the PRBS and, generates a transmit signal based on the PRBS according to a defined modulation. The modulator 105 may modulate a transmit signal according to any suitable modulation scheme for generating multi-bit symbols.

One known type of modulation involves modulating a signal level of the transmit signal. Depending on the type of transmit signal and modulation applied, the signal level which is modulated may be an instantaneous magnitude of the relevant signal, e.g. a voltage of an electrical signal, or an amplitude or intensity of a carrier signal, e.g. an intensity of an optical signal, such as in a pulse amplitude modulation scheme or the like. The signal level of the transmit signal may be modulated between sufficient distinct values to represent the desired number of bits.

For instance, two bits may be transmitted by modulating to the signal level to one of four different signal levels. As an example, consider that the input to the modulator 105 comprises the following series of bits:
  0 1 0 0 1 0 0 1 1 0 1 1 0 0 1 1 1 1 0 0 0 1 0 1 0 1 0 1 1 0 0 0 0 1 (seq. 1)
This sequence can be grouped into 2-bit pairs as:
  01 00 10 01 10 11 00 11 11 00 01 01 01 01 10 00 01 (seq. 2)
Each pair of bits is then used to modulate the signal level of the transmit signal to one of four different possible signals levels, e.g. L0, L1, L2 or L3. The bit pairs may be mapped to the different signal levels by the modulator 105 according to any desired encoding. For example, the conventional values of the bit pairs, i.e. decimal values 0 to 3 could be mapped to the corresponding increasing signal levels L0 to L3, although in some implementations it may be advantageous to employ some other coding, such as Gray coding. As will be understood by one skilled in the art, Gray coding may be applied so that for adjacent signal levels, the corresponding bits pairs differ by only one bit. Using Gray coding the mapping could be L0:00, L1:01, L2:11 and L3:10.

Figure 2:
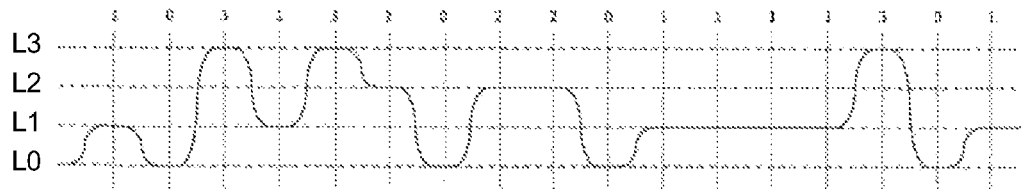
FIG. 2 illustrates an example waveform of a signal for transmission of data using PAM4 multi-bit symbols.

Applying Gray coding, the sequence of bit pairs could be encoded as a sequence:

L1 L0 L3 L1 L3 L2 L0 L2 L2 L0 L1 L1 L1 L1 L3 L0 L1 (seq. 3)

as represented by the example waveform in FIG. 2 which represents, in this example, the waveform of the transmit signal generated by the modulator 105.

Referring back to FIG. 1, the modulated transmit signal can then be transmitted over the communication channel 103 and received by the receiver 102.

In the example of FIG. 1, the receiver 102 includes an error checker 106. The error checker 106 includes a demodulator 107 that is configured to determine, for each symbol period, the relevant signal level of the received signal, and hence the data bits represented by that symbol.

In order to be able to fully determine the symbol received in a given symbol period, the demodulator 107 comprises multiple detectors 108. The number and type of detectors 108 will depend on the modulation scheme used for the multi-bit symbols.

In the example of FIG. 1, where the transmit signal is modulated between four different signal levels, the demodulator 107 comprises three detectors 108. Each detector 108 is configured to determine, whether, at a particular sampling point during the symbol period, the signal received via the communication channel has a signal level above or below a defined threshold. The thresholds are set with respect to received signal levels L0' to L4' that correspond to the signal levels L0 to L4 of the transmit signal taking into account any propagation losses in the communication channel and/or gain of the detectors etc. A first detector D1 may thus determine whether or not the signal level is above a first threshold which is lies between the signal levels L0' and L1', a second detector D2 may determine whether or not the signal level is above a second threshold which is lies between the signal levels L1' and L2' and a third detector D3 may determine whether the signal level is above a third threshold which is lies between the signal levels L2' and L3'. In this example, the output from the three detectors 108 is thus effectively a thermometer code that indicates the signal level of the received signal.

As noted above, other modulation schemes could alternatively be used to modulate the transmit signal to provide multi-bit symbols. For instance, some modulation schemes may modulate the transmit signal by controlling the phase or a phase shift of a carrier signal. Quadrature Phase Shift Keying (QPSK), for example, may set a phase shift equal to one of four values so as to encode two bits. In which case, the demodulator 107 may comprise two detectors, and in-phase detector and a quadrature detector. In general, however, the demodulator 107 will typically require multiple detectors 108 in order to fully demodulate each symbol.

In the example of FIG. 1, the demodulator includes a binary converter 109 for receiving the output from each of the detectors 108 and determining, based on the appropriate coding, e.g. Gray coding, the corresponding binary bit pair. The binary converter 109 thus outputs a binary bit sequence representing the demodulated data.

To determine whether there are any errors, the demodulated bit stream from the demodulator 107 is supplied to a PRBS module 110 that operates to generate the known PRBS synchronised to the demodulated bit stream. There are various ways in which the PRBS module 110 may generate the known PRBS synchronised to the received data, as will be understood by one skilled in the art. A comparator 111 compares the demodulated bit stream from the demodulator 107 with the known PRBS and thus indicates every time there is a mismatch between a bit of the bit stream as demodulated and the bit sequence that was expected, i.e. each instance of an error. The number of errors may be determined to provide an indication of bit error rate and/or bit error The error checker 106 of the receiver 102 thus enables a determination of the error rate/ratio for data transmitted as multi-bit symbols via the communication channel 103, so as to provide a measure of quality of the transmission via the communication channel.

However the presence of the error checker 106 within the receiver 102 can add to the size and cost of the receiver circuitry and also the power consumption in use, in particular due to the requirement for multiple detectors 108 operating at the symbol rate to fully demodulate the received signal.

Embodiments of the present disclosure relate to error checking for channel quality determination that may offer advantages in terms of at least one of power consumption, size, cost and/or complexity.

Embodiments of the present disclosure relate to an error checker that receives a transmit signal comprising a series of multi-bit symbols encoding a PRBS and which partially demodulates the received signal. The partial demodulation is sufficient to identify at least some of the bits encoded by at least some of the symbols in the received signal, but not every incoming symbol is fully demodulated to identify every bit encoded by that symbol.

The partially demodulated bit stream thus only represents part of the PRBS as transmitted. However, due to the deterministic nature of a PRBS, it is possible to determine all the bits in the sequence or any desired bits in the sequence, e.g. every $N^{th}$ bit and likewise, given a certain number of bits and their relevant position to one another, i.e. the number of intervening bits, it is possible to infer the full PRBS.

As only a partial demodulation is required, in at least some implementations the number of detectors required may be reduced, compared to the number of detectors required for full demodulation of a symbol.

Figure 3:
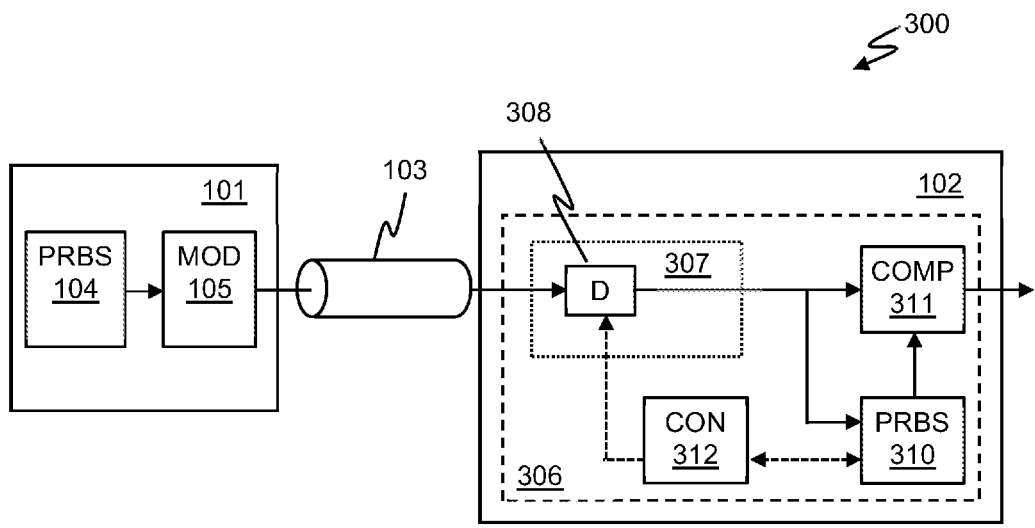
FIG. 3 illustrates an error checker for checking for errors in a multi-bit communication system according to an embodiment.

FIG. 3 illustrates a communication system 300, in which similar components as discussed with reference to FIG. 1 are identified by the same reference numerals, but where the receiver 102 includes an error checker 306 according to an embodiment.

FIG. 3 illustrates that a receiver 101 is configured to transmit data to the receiver via a communication channel 103. FIG. 3 illustrates that the transmitter 101 comprises a modulator 105 for modulating a transmit signal with multi-bit symbols based on a PRBS generated by PRBS generator 104 as discussed with respect to FIG. 1. Again, FIG. 3 only illustrates components relevant for the purposes of explanation of the error checking.

The transmit signal received by the receiver is input to a demodulator 307, which, in this example, provides partial demodulation of the received symbols and includes a single detector 308. In examples where the symbols are modulated in signal level the detector 308 may be a threshold detector, for determining whether or not the received signal level is above a threshold.

For example, consider that the signal level of the symbols is modulated to encode pairs of bits as discussed with reference to FIGS. 1 and 2 above, e.g. that the signal received by the detector 308 has the waveform illustrated in FIG. 2. In this case, the threshold for the detector 308 may be set, at least initially, at a level which is between the signal levels L1' and L2'. The output of the detector 308 would thus indicate whether a given incoming symbol had a signal level above the threshold, i.e. could correspond to a modulated signal level of L2 or L3, or below the threshold, i.e. correspond to a modulated signal level of L0 or L1. The output of the detector 308 will thus indicate the value of one of the bits of the bit pair. As discussed above, with Gray coding, the signal levels L2 and L3 correspond to the bit pairs 11 and 10 respectively, whereas the signal levels L0 and L1 correspond to the bit pairs 00 and 01 respectively. With a threshold set between L1' and L2', the output of the detector would thus correspond to the value of the first bit of the bit pair encoded by the relevant symbol and thus, in effect, the single detector 308 directly demodulates the first bit of the bit pair.

For the waveform illustrated in FIG. 2, the output of the detector 308 would thus, if there was no error, be:

0 0 1 0 1 1 0 1 1 0 0 0 0 1 0 0 (seq. 4)

which corresponds to the bit sequence:

0? 0? 1? 0? 1? 1? 0? 1? 1? 0? 0? 0? 0? 0? 1? 0? 0? (seq. 5)

where ? represents an unknown bit.

This partial information is, however, sufficient to infer the full underlying PRBS and allow synchronisation thereto. As noted above, given that the PRBS is deterministic, it is possible to determine each bit in the sequence, or alternatively to determine any Nth bit in the sequence without cycling through all the intermediate bit value. Determining every Nth bit of a PRBS generates a cyclotomic coset of the PRBS. In cases where N is a power of 2 or relatively prime to the length of the PRBS, the cyclotomic coset will have a maximum length which is the same as the original PRBS. Given the properties of the PRBS and its cyclotomic cosets, the partial decoding of the incoming symbols is sufficient to allow synchronisation to a locally generate PRBS.

The partially demodulated output from the partial demodulator 307 is thus supplied to a PRBS module 310 of the receiver that uses the partial sequence to infer the PRBS during a synchronisation phase. Only a limited number of bits of the partially decoded sequence may be required to infer the PRBS. In effect, the PRBS module 310 may synchronize to the sequence of the relevant cyclotomic coset, from which the full PRBS can be inferred.

The inference may be performed in a variety of way. For instance, consider that each decoded bit of the PRBS corresponds to the observation of a single bit in a state register that generated it. A state register used to generate a PRBS corresponds to the values of a quotient ring where each subsequent value, expressed in polynomial form, is derived by multiplying the state by $x^1$ followed by a polynomial division by the generator polynomial. This progression of values can be expressed as the matrix multiplication of the state register by a constant (under modulo-2 arithmetic). Since all states depend on the previous one, all future states can be calculated by cascading matrix multiplications with the current state. It is therefore possible to establish a system of linear equations with unknown state values that depend exclusively on the observed bits of the PRBS. Solving this set of equations allows inference of values of the state register at any time relative to the observed bits. The PRBS module 310 may thus be configured to effectively solve an appropriate set of linear equations, as would be understood by one skilled in the art. The PBRS module may be implemented by any suitable means for performing the inference and, for example, be at least partly implanted by a suitable programmed processor and/or may comprise at least some dedicated circuitry.

Once the PRBS module 310 is synchronised to the partially demodulated data and the PRBS can be inferred, the expected signal level of any incoming symbol can also be inferred. The output of the detector 308 can thus be compared, by comparator 311, to the expected output from the detector to determine the extent of any errors during an error checking phase.

For instance, as discussed above, if the detector 308 is operated with a threshold which is set between signal levels L1' and L2', the output of the detector essentially demodulates the first bit of each bit pair encoded by an incoming symbol. Once the PRBS has been correctly inferred, the relevant output from the detector 308 can be compared to the relevant bit of the locally inferred PRBS, i.e. every other bit of the PRBS. If the transmitter repeatedly transmits the full PRBS and the detector provides an output for every incoming symbol, then over the course of two iterations of the full PRBS, the error checker will effective check every bit of the PRBS.

Whilst maintaining the threshold of the detector 308 at a constant level between L1' and L2' will allow for all bits of the PRBS to be checked over time, this does not provide a check that all different symbol levels are received correctly, i.e. an error would be detected if a symbol that was transmitted at the signal level L2 was received and demodulated as L1' but not if the symbol was received and demodulated as level L3'. To provide a check of the different symbol levels, once the PRBS has been correctly inferred, the threshold of the detector 308 may be varied to provide discrimination between the other symbol levels.

Once the PRBS has been inferred, the bits pairs of the PRBS used to encode the symbols and hence the expected modulation of the symbol is known. The detector could be set to any desired threshold level and the output from the detector compared to the expected output for the expected symbol level. Over time this can allow all bit values of the PRBS to be checked for all symbol levels. The error checker 306 may thus include a controller 312, as illustrated in FIG. 3, operable to control the threshold of the detector 308.

For example, the controller 312 may initially set the threshold of the detector 308 to be between L1' and L2' as discussed, to allow partial demodulation of the incoming data to identify one of the encoded bits, so as to allow for synchronisation and inference of the PRBS. Once the PRBS has been correctly inferred, the PRBS module 310 can generate the expected value of the relevant bits of the PRBS and the comparator 311 will compare the output of the detector with the expected value to determine any errors. In one implementation the threshold may be maintained at the same level between L1' and L2' until all values of the PRBS have been checked.

The controller 312 may then vary the threshold of the detector, e.g. to a level between L0' and L1' or to a level between L2' and L3'. The PRBS module 310 may then generate a sequence corresponding to the expected output of the detector 307 for that threshold level, given the coding scheme used.

For instance, for the bit sequence 1 described above, the modulation scheme would be expected to generate the signal level sequence 3 described above, i.e. the waveform illustrated in FIG. 2. With a single detector 308 and a threshold set between L0' and L1, the expected output of the detector would be:

1 0 1 1 1 1 0 1 1 0 1 1 1 1 1 0 1 (seq. 6)

whereas, if the threshold were instead set between L2' and L3', the expected output would be:

0 0 1 0 1 0 0 0 0 0 0 0 0 1 0 0 (seq. 7).

The controller 312 may thus selectively vary the threshold of the detector 308 and also control the PRBS module to provide an appropriate output based on the selected threshold. By varying the relevant threshold and the corresponding output from the PRBS generator, then given sufficient time, the receiver can check the correct reception of all signal levels for all bits values of the PRBS and thus the error checker can allow assessment of the communication channel 103 by allowing the same quantitative measurements of the communication channel as the conventional approach discussed with respect to FIG. 1.

For instance the controller 312 could operate with a set threshold, say between L0' and L1, and verify whether the output of the detector matches the expected level for every symbol of the full PRBS, and then vary the threshold to a different level, e.g. between L2' and L3' and repeat the verification for that threshold. This could be repeated for all relevant thresholds if desired. It will be understood, however, that the thresholds could be varied in any desired way.

In some applications, however, it may be sufficient to generate a measure of quality with a partial characterisation, e.g. it may be sufficient to determine the number of errors whilst operating with the different thresholds without necessarily requiring each symbol to be checked whilst using each threshold.

It will be understood that with the threshold set to the a level between L0' and L1', or to a level between L2' and L3', the output of the detector is a partial demodulation that does not directly correspond to the individual bit values of the PRBS, and thus such thresholds are not used during the initial synchronisation phase of inferring and synchronising the local PRBS in the receiver. However, the output of the detector using thus threshold can be used to detect errors in the received symbol value based once the PRBS has been inferred and thus the expected signal level is known.

Embodiments of the disclosure thus allow the error checker 306 of a receiver to be implemented with fewer detectors than the conventional approach discussed with reference to FIG. 1. The embodiment of FIG. 3 allows the error checker to be implemented with a single detector. The use of a single detector 308, compared to the three detectors 108 illustrated in FIG. 1, thus can allow the error checker of embodiments of the disclosure to be smaller and cheaper than convention error checkers. Also, using fewer detectors 308 can reduce power consumption in use.

FIG. 3 illustrates an example with just a single detector 308. The number of detectors required will depend on the type of modulation scheme used. The demodulator 307 of the error checker 306 should have sufficient detectors to be able to correctly identify one of the bits encoded by the relevant symbol. Decoding one of the bits is sufficient to allow for the underlying PRBS to be inferred.

For instance for a phase shift modulation, such as QPSK, the error checker 306 could comprise a single detector with a configurable phase, rather than two separate detectors as would be needed to fully demodulate the received signal. The received signal could be processed by the detector to provide an indication of one of the bits, say the in-phase its. The quadrature-bits could then be verified by reconfiguring the phase of the detector.

In general, therefore, the demodulator includes at least one detector for generating an output based on a physical property of the input signal which is modulated to encode the multiple bits. The demodulator is be operable with a first detector configuration that provides a first partial demodulation during the synchronisation phase, where the first partial demodulation identifies one of the bits encoded by the relevant symbol. The demodulator is also operable with one or more other detector configurations, that provide different partial demodulations, that do not necessarily result in actual bits of the PRBS being identified, but which allow for verification of the received symbols as would be decoded.

Whilst, the error checker may advantageously be implemented with just the minimum number of detectors required to be able to correctly identify one of the bits encoded by the symbol, in some applications, where size and cost are not a significant constraint, the error checker may comprise multiple detectors, possibly even a sufficient number of detectors to allow all bits encoded by a given symbol to be fully decoded. The error checker could then be operable in different modes, for instance the error checker could be operated with all detectors active to provide full demodulation of every symbol as discussed with reference to FIG. 1, but the error checker may also be operable in mode in which only one or some of the detectors are active to provide partial demodulation according to the present disclosure. The partial demodulation mode may be used to reduce power consumption in applications where the time required to provide a channel quality measurement is not critical, but the full demodulation mode could be used in application where a faster determination of channel quality is required.

In some implementations, the detector may operate to provide an output for every symbol, as described above, i.e. the sample rate of the detector may be equal to the symbol rate in the received signal. However, in some implementations the detector 308 may be controlled by controller 312 so as to operate at a sample rate which is lower than the symbol rate of the received signal. That is, rather than provide an output for each symbol, the detector 308 may provide an output for only every Mth symbol. Again, due to the properties of the PRBS and its cyclotomic cosets, if the detector only provided an output from every Mth sample, it would still be possible to infer and synchronise to the underlying PRBS and, once synchronised, determine the expected signal level for the relevant symbol. Over time, if the sequence of symbols encoding the PBRS is repeatedly transmitted, as would usually be the case, the full set of symbols may be checked, for all signal levels, but operating with a reduced sample rate for the detector may reduce power compared with sampling at the symbol rate. In at least some applications, the time required to determine a measure of quality for the communication channel, i.e. to determine the extent of any errors, may not be critical and operating at a lower sample rate may thus reduce power consumption.

For example, for the example discussed above, if the detector 308 were operated at a rate to sample every $4^{th}$ symbol, then when initially operating with the threshold between L1 and L2' to provide partial demodulation of the received symbols, the detector would effectively demodulate every $8^{th}$ bit of the PRBS. The PRBS module 310 would thus provide synchronisation to the PRBS based on every $8^{th}$ bit. Once synchronised, the PRBS module 310 may generate the expected output of the detector 308 for every $4^{th}$ symbol.

As the transmitter will generally repeatedly transmit the PBRS, the sequence of symbols encoding the PBRS will be repeated and, once synchronised, the same symbol in the sequence may be checked using different thresholds in a subsequent iteration of the sequence and/or different symbols may be checked in a subsequent iteration. Thus, for example, if every fourth symbol were used for initial synchronisation and checking during a first iteration of the sequence, any of the intervening symbols could be checked in a subsequent iteration by altering the sampling times.

In general, the controller 312 may control the detector 308 to sample at any given rate or to sample any desired symbols and control the PRBS module to generate the expected output for the given threshold.

Embodiments thus provide an error checker for a receiver that provides for partial demodulation of multi-bit symbols. Embodiments may benefit from one or more of the following advantages. The error checker may be implemented with fewer detectors than would conventionally be required. Reducing the number of detectors to provide error checking allows for reduced complexity and simplifies the task of implementing an error checker. The error checker may operate with fewer detectors than the conventional approach, with consequent power saving compared to full demodulation. In some application the error checker need not operate at the full symbol rate. Embodiments exploit the properties of PRBSs to allow verification to occur over time, allowing for a reduced sample rate and hence lower power consumption. The circuit can be smaller and lower cost due to the reduced number of detectors. Smaller and less complex circuit are also typically easier to verify and have fewer design challenges.

It will be understood that the examples and embodiments described above are given by way of example only and those skilled in the art will understand that modifications, variations, additions or alterations may be made to specific embodiments described, or alternative embodiments may be implemented, without departing from the scope of the appended claims.

It should be noted that as used herein, unless expressly stated otherwise, the word "comprising" does not exclude the presence of other elements or steps other than those listed, references to an element or feature in the singular does not exclude the possibility of a plurality of such elements or features, and that recitation of different features or elements in the appended claims does not necessarily imply separate components; a single component or unit may fulfil the function of several elements recited in a claim. Any reference signs in the appended claims shall not be construed so as to limit their scope.

The invention claimed is:

1. An error checker comprising:
    an input for receiving an input signal comprising a series of modulated symbols, wherein each symbol encodes multiple bits of a pseudo-random bit sequence;
    a demodulator configured to receive the input signal and only partially demodulate at least some of the symbols to generate a partially demodulated bit sequence;
    a PRBS module configured to receive the partially demodulated bit sequence and determine the pseudo-random bit sequence; and
    a comparator to compare the output of the demodulator to an expected output based on the pseudo-random bit sequence determined by the PRBS module.

2. The error checker of claim 1 wherein the demodulator comprises a detector for generating an output based on a physical property of the input signal which is modulated to encode the multiple bits.

3. The error checker of claim 2 wherein the detector is reconfigurable to vary a demodulation provided by the demodulator.

4. The error checker of claim 3 comprising a controller configured to control the error checker in a synchronisation phase in which the detector has a first configuration such that the output of the demodulator corresponds to one of the bits encoded by a relevant symbol and in which the PRBS module is configured to receive the partially demodulated bit sequence and determine the pseudo-random bit sequence during the synchronisation phase.

5. The error checker of claim 4 wherein the controller is configured to control the error checker, subsequent to synchronisation phase, in a checking phase in which the comparator is controlled to compare the output of the demodulator to an expected output based on the pseudo-random bit sequence determined by the PRBS module.

6. The error checker of claim 5 wherein the controller is configured to, during at least part of the checking phase, reconfigure the detector to a second configuration so as to provide a different partial demodulation of a symbol.

7. The error checker of claim 2 wherein said physical property is a signal level of the input signal and said detector is a threshold detector for detecting whether or not the signal level is above a defined threshold.

8. The error checker of claim 7 wherein a controller is operable to selectively vary the defined threshold.

9. The error checker of claim 8 wherein the PRBS module is configured to determine the expected output of the demodulator based on the determined pseudo-random bit sequence and the defined threshold.

10. The error checker of claim 8 wherein the controller is operable to selectively vary the defined threshold over a predefined set of thresholds.

11. The error checker of claim 10 wherein each symbol of the input signal is modulated to one of four different modulation signal levels and the predefined set of thresholds comprises a set of three thresholds, each threshold being set between different pairs of adjacent modulation signal levels.

12. The error checker of claim 2 wherein said physical property is a phase of the input signal and the detector is a detector for detecting a phase modulation of the input signal.

13. The error checker of claim 2 wherein the detector is reconfigurable to provide an in-phase or a quadrature demodulation.

14. The error checker of claim 1 wherein a controller is configured to control the demodulator so as to demodulate only some of the symbols of the input signal.

15. The error checker of claim 1 operable at a sample rate which is lower than a symbol rate of the input signal.

16. A receiver for data communication system comprising the error checker of claim 1.

17. The receiver of claim 16 wherein the receiver is configured to receive in the input signal as optical data transmitted over an optical waveguide.

18. A method of checking for data errors in a communication channel comprising:
    receiving an input signal comprising a series of modulated symbols, wherein each symbol encodes multiple bits of a pseudo-random bit sequence;
    only partially demodulating, by a demodulator, at least some of the symbols to generate a partially demodulated bit sequence;
    determining the pseudo-random bit sequence from the partially demodulated bit sequence; and
    comparing the output of the demodulator to an expected output based on the pseudo-random bit sequence determined by a PRBS module.

19. The method of claim 18 where the method comprises:
    operating in a synchronisation phase in which partially demodulating at least some of the symbols comprises identifying one of the bits encoded by a relevant symbol and the pseudo-random bit sequence is determined during the synchronisation phase; and subsequently operating in a checking phase and wherein the partial demodulation is varied for at least part of the checking phase.

20. The method of claim 19 where the symbols are modulated in signal level and the symbols are partially demodulated by a threshold detector which compares the signal level to a first threshold during the synchronisation phase and which compares the signal level to a different threshold during at least part of the checking phase.

\* \* \* \* \*